(12) United States Patent
Saito et al.

(10) Patent No.: US 7,989,910 B2
(45) Date of Patent: Aug. 2, 2011

(54) SEMICONDUCTOR DEVICE INCLUDING A RESURF REGION WITH FORWARD TAPERED TEETH

(75) Inventors: Wataru Saito, Kawasaki (JP); Syotaro Ono, Yokohama (JP); Masaru Izumisawa, Himeji (JP); Yasuto Sumi, Himeji (JP); Hiroshi Ohta, Fuchu (JP); Wataru Sekine, Himeji (JP); Nana Hatano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 12/252,872

(22) Filed: Oct. 16, 2008

(65) Prior Publication Data

US 2009/0101974 A1    Apr. 23, 2009

(30) Foreign Application Priority Data

Oct. 22, 2007    (JP) .................................. 2007-273430

(51) Int. Cl.
    *H01L 29/66*    (2006.01)
(52) U.S. Cl. ................ 257/493; 257/492; 257/E27.096; 438/588
(58) Field of Classification Search .................. 257/341, 257/342, 491–493, E27.091, E27.095, E27.096; 438/588
    See application file for complete search history.

(56) References Cited

U.S. PATENT DOCUMENTS

| | | | |
|---|---|---|---|
| 6,614,089 B2 * | 9/2003 | Nakamura et al. | 257/492 |
| 6,693,338 B2 * | 2/2004 | Saitoh et al. | 257/492 |
| 6,724,042 B2 * | 4/2004 | Onishi et al. | 257/341 |
| 6,844,592 B2 * | 1/2005 | Yamaguchi et al. | 257/341 |
| 7,115,475 B2 | 10/2006 | Yamaguchi et al. | |
| 7,436,024 B2 * | 10/2008 | Kumagai et al. | 257/335 |
| 2006/0220156 A1 * | 10/2006 | Saito et al. | 257/409 |
| 2006/0231917 A1 * | 10/2006 | Ono et al. | 257/500 |
| 2007/0102773 A1 * | 5/2007 | Hisatomi et al. | 257/401 |
| 2007/0138543 A1 * | 6/2007 | Saito | 257/328 |
| 2008/0135926 A1 * | 6/2008 | Ono et al. | 257/328 |
| 2009/0085116 A1 * | 4/2009 | Aoki | 257/355 |
| 2010/0059818 A1 * | 3/2010 | Sasaki | 257/339 |

FOREIGN PATENT DOCUMENTS

| | | |
|---|---|---|
| JP | 2003-273355 | 9/2003 |
| JP | 2007-5516 | 1/2007 |
| JP | 2007-157797 | 6/2007 |

OTHER PUBLICATIONS

Udrea et al., "Ultra-high voltage device termination using the 3D RESURF (super-junction) concept—experimental demonstration at 6.5kV". Power Semiconductor Devices and ICs, 2001. ISPSD '01. Proceedings of the 13th International Symposium on. Publication Year: 2001 , pp. 129-132.*
U.S. Appl. No. 12/620,045, filed Nov. 17, 2009, Ohta, et al.

* cited by examiner

*Primary Examiner* — Thao X Le
*Assistant Examiner* — William F Kraig
(74) *Attorney, Agent, or Firm* — Oblon, Spivak, McClelland, Maier & Neustadt, L.L.P.

(57) ABSTRACT

A semiconductor device includes an n+ type semiconductor substrate 1 and a super junction region that has, on the top of the substrate 1, an n and p type pillar regions 2 and 3 provided alternately. The device also includes, in the top surface of the super junction region, a p type base region 4 and an n type source layer 5. The device also includes a gate electrode 7 on the region 4 and layer 5 via a gate-insulating film 6, a drain electrode 9 on the bottom of the substrate 1, and a source electrode 8 on the top of the substrate 1. In the top surface of the super junction region in the terminal region, a RESURF region 10 is formed. The RESURF region has a comb-like planar shape with repeatedly-formed teeth having tips facing the end portion of the terminal region.

18 Claims, 15 Drawing Sheets

2  3  10

2  3  10

DEVICE REGION

TERMINAL REGION

DEVICE REGION
TERMINAL REGION

DEVICE REGION
TERMINAL REGION

SEMICONDUCTOR DEVICE INCLUDING A RESURF REGION WITH FORWARD TAPERED TEETH

CROSS REFERENCE TO RELATED APPLICATIONS

This application is based on and claims the benefit of priority from prior Japanese Patent Application No. 2007-273430, filed on Oct. 22, 2007, the entire contents of which are incorporated herein by reference.

BACKGROUND OF THE INVENTION

1. Field of the Invention

The present invention relates to a semiconductor device, and more particularly, to a semiconductor device including a super junction region.

2. Description of the Related Art

Vertical power metal oxide semiconductor field effect transistors (MOSFET) each have an ON-resistance that largely depends on the electrical resistance of the conductive layer (drift layer). The drift layer's electrical resistance depends on the impurity concentration thereof. A higher impurity concentration causes a lower ON-resistance. The higher impurity concentration, however, provides a lower breakdown voltage of the pn junction between the drift layer and the base layer. The impurity concentration thus cannot be higher than a limit level based on a breakdown voltage. There is a trade-off between the device breakdown voltage and the ON-resistance. It is important to improve the trade-off to provide a low power consumption semiconductor device. The trade-off has a limit level based on the device material. Providing a trade-off beyond the limit level is the way to achieve the low ON-resistance semiconductor device.

A known example of the MOSFET to solve the problems has a super junction region in the drift layer. The super junction region has vertical strip p and n type pillar regions. The two type pillar regions are alternately embedded in a lateral direction. The super junction region has the same charge amount (impurity amount) in the p and n type pillar regions to form a pseudo non-doped layer. The non-doped layer may hold the high breakdown voltage. The super junction region also has a highly doped n type pillar region through which a current passes through. The low ON-resistance beyond the material limit is thus provided.

In the semiconductor device having the super junction region, in order for the device region to hold the high breakdown voltage, the impurity amount should be accurately controlled in the n and p type pillar regions. Like the device region, the terminal region in the semiconductor device may be provided with a high concentration n type pillar region and also a high concentration p type pillar region to provide the high breakdown voltage. In the terminal region, the depletion layer may be extended both in the longitudinal direction of the alternately embedded pillar regions and in the direction perpendicular thereto. The electric field concentration may thus be reduced at the end portion of the p type base layer extending to the terminal region. The high breakdown voltage may thus be provided. In order to extend the depletion layer in the direction perpendicular to the longitudinal direction of the alternately embedded pillar regions, a known configuration includes a RESURF region and a field plate electrode in the surface of the terminal region (see, for example, JP 2003-273355).

Variation of the impurity amount of the p and n type pillar regions in the super junction region in the semiconductor device will decrease the breakdown voltage of the device region and the terminal region. Variation of the impurity amount of the p and n type pillar regions in the super junction region in the terminal region will change the electric field distribution in the terminal region. The electric field distribution change in the terminal region may generate a local electric field concentration. The electric field concentration may contribute to the reliability reduction, including the leak current variation, and the device breakdown due to the breakdown voltage reduction in the terminal region.

SUMMARY OF THE INVENTION

An aspect of the present invention is a semiconductor device comprising: a semiconductor substrate of a first conductivity type having top and bottom surfaces that are opposed to each other, the semiconductor substrate having a device region and a terminal region surrounding the device region; a super junction region having, on the top surfaces of the device and terminal regions, a first semiconductor pillar region of the first conductivity type and a second semiconductor pillar region of a second conductivity type, the first and second semiconductor pillar regions being alternately provided along the top surface of the semiconductor substrate; a first main electrode electrically connected to the bottom surface of the semiconductor substrate; a semiconductor base region of the second conductivity type selectively provided in the top surface of the super junction region; a semiconductor diffusion region of the first conductivity type selectively provided in the top surface of the semiconductor base region; a second main electrode electrically connected to the semiconductor base region and the semiconductor diffusion region; a control electrode provided, via an insulating film, on a region that includes the semiconductor diffusion region, the semiconductor base region, and the first semiconductor pillar region; and a RESURF region of the second conductivity type provided in the top surface of the super junction region in the terminal region, the RESURF region being connected to the semiconductor base region, the RESURF region having a comb-like planar shape with repeatedly-formed teeth having tips facing the end portion of the terminal region, and the tip of the teeth being forward tapered toward its tip.

Another aspect of the present invention is a semiconductor device comprising: a semiconductor substrate of a first conductivity type having top and bottom surfaces that are opposed to each other, the semiconductor substrate having a device region and a terminal region surrounding the device region; a super junction region having, on the top surfaces of the device and terminal regions, a first semiconductor pillar region of the first conductivity type and a second semiconductor pillar region of a second conductivity type, the first and second semiconductor pillar regions being alternately provided along the top surface of the semiconductor substrate; a first main electrode electrically connected to the bottom surface of the semiconductor substrate; a semiconductor base region of the second conductivity type selectively provided in the top surface of the super junction region; a semiconductor diffusion region of the first conductivity type selectively provided in the top surface of the semiconductor base region; a second main electrode electrically connected to the semiconductor base region and the semiconductor diffusion region; a control electrode provided, via an insulating film, on a region that includes the semiconductor diffusion region, the semiconductor base region, and the first semiconductor pillar region; and a RESURF region of the second conductivity type provided in the top surface of the super junction region in the terminal region, the RESURF region being connected to the semiconductor base region, the RESURF region having a comb-like planar shape with repeatedly-formed teeth having tips facing the end portion of the terminal region.

Still another aspect of the present invention is a semiconductor device comprising: a semiconductor substrate of a first conductivity type having top and bottom surfaces that are opposed to each other, the semiconductor substrate having a device region and a terminal region surrounding the device region; a super junction region having, on the top surfaces of the device and terminal regions, a first semiconductor pillar region of the first conductivity type and a second semiconductor pillar region of a second conductivity type, the first and second semiconductor pillar regions being alternately provided along the top surface of the semiconductor substrate; a first main electrode electrically connected to the bottom surface of the semiconductor substrate; a semiconductor base region of the second conductivity type selectively provided in the top surface of the super junction region; a semiconductor diffusion region of the first conductivity type selectively provided in the top surface of the semiconductor base region; a second main electrode electrically connected to the semiconductor base region and the semiconductor diffusion region; a control electrode provided, via an insulating film, on a region that includes the semiconductor diffusion region, the semiconductor base region, and the first semiconductor pillar region; and a RESURF region of the second conductivity type provided in the top surface of the super junction region in the terminal region, the RESURF region being connected to the semiconductor base region, the RESURF region having a comb-like planar shape with repeatedly-formed teeth having tips facing the end portion of the terminal region, and the RESURF region being provided around the entire periphery of the semiconductor base region.

DETAILED DESCRIPTION OF THE EMBODIMENTS

With reference to the accompanied drawings, embodiments of the present invention will be described below. In the following embodiments, an MOSFET is assumed in which a first conductivity type is n type and a second conductivity type is p type. Note that "p+ type" refers to a semiconductor region having a higher p type impurity concentration than the "p type" semiconductor region. Note also that "p− type" refers to a semiconductor region having a lower p type impurity concentration than the "p type" semiconductor region. Likewise, "n+ type" and "n− type" refer to semiconductor regions having a higher and a lower n type impurity concentration than the "n type" semiconductor region, respectively.

First Embodiment

Figure 1:
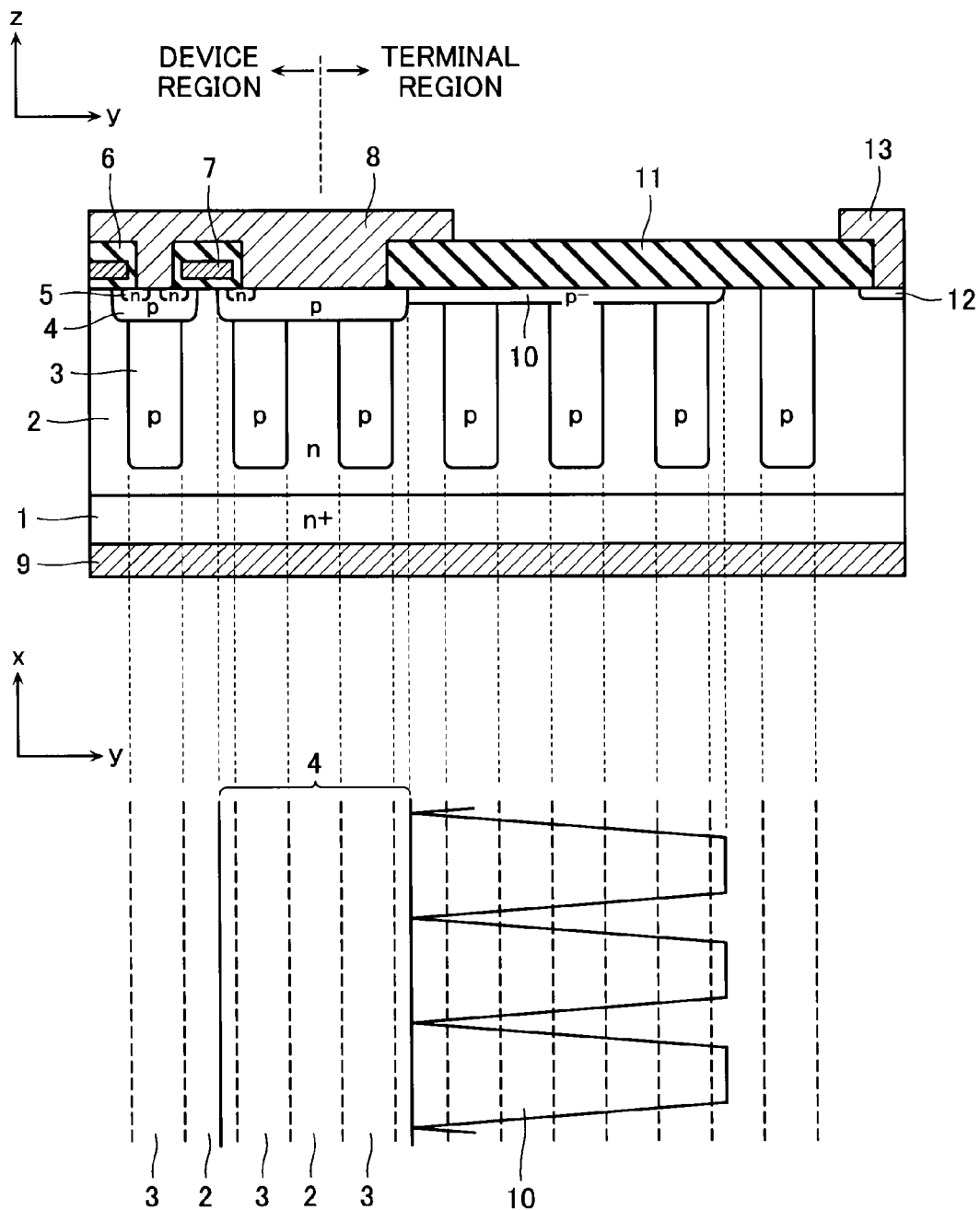
FIG. 1 is a cross-sectional view and a plan view of the structure of a semiconductor device according to a first embodiment.

FIG. 1 is a cross-sectional view and a plan view of the structure of a semiconductor device according to a first embodiment of the present invention. In FIG. 1, the upper portion is a cross-sectional view of the semiconductor device taken along the y-z plane. The lower portion in FIG. 1 is a plan view taken along the x-y plane. In FIG. 1, the semiconductor device of this embodiment is an n channel planar-gate type MOSFET having a super junction region to which the present invention is applied. FIG. 1 shows a device region and a terminal region of the MOSFET.

With reference to FIG. 1, the semiconductor device in this embodiment is formed on an n+ type semiconductor substrate 1. The substrate 1 has top and bottom surfaces that are opposed to each other. The substrate 1 is made of, for example, silicon (Si). On the top surface of the n+ type semiconductor substrate 1, the device region and the terminal region are formed. Both of the device and terminal regions include an n type pillar region 2 and a p type pillar region 3. The n type pillar regions 2 and the p type pillar 3 both have a cross-section of a vertical strip. The n and p type pillar regions 2 and 3 are alternately provided in a lateral direction (in the y-direction in FIG. 1) along the top surface of the n+ type semiconductor substrate 1. The n and p type pillar regions 2 and 3 comprise the super junction region. The p type pillar regions 3 are repeatedly provided. The n type pillar regions 2 are provided between the p type regions 3. On the p and n type pillar regions 3 and 2, p type base regions 4 are selectively provided in a stripe pattern. Each region 4 is connected to the p and n type pillar regions 2. Additionally, in the top surfaces of the p type base regions 4, n type source layers 5 are selectively provided in a stripe pattern. Each n type source layer 5 is connected to the p type pillar region 3 via the p type base region 4.

Note that FIG. 1 shows an example where the bottom surface of each p type pillar region 3 is not in contact with the n+ type semiconductor substrate 1 and a portion of the n type pillar region 2 resides between the bottom of the p type pillar region 3 and the n+ type semiconductor substrate 1. Alternatively, the bottom of each p type pillar region 3 may be in contact with the n+ type semiconductor substrate 1. To improve the breakdown voltage characteristics, the p type base regions 4 partially extend in the terminal region from the device region.

Gate electrodes 7 are formed, via gate-insulating films 6, on the n type source layers 5, the p type base regions 4, and the n type pillar regions 2 in a stripe pattern. With reference to FIG. 1, a set of the gate-insulating film 6 and the gate electrode 7 may be common to two adjacent p type base regions 4 on opposite sides of one n type pillar region 2. The gate-insulating film 6 may be made of, for example, a silicon oxide film of 0.1 μm thickness. When a gate voltage of a threshold voltage or more is applied, the gate electrode 7 may cause a channel in the p type base region 4. The channel extends parallel to the n+ type semiconductor substrate 1 (in the y-direction in FIG. 1). The MOSFET is thus rendered conductive.

On the p type base region 4 and n type source layer 5, a source electrode 8 is formed. The electrode 8 is electrically connected to the n type source layer 5 and also to the p type pillar region 3 via the p type base region 4. The source electrode 8 is common to each MOSFET. The source electrode 8 is isolated from the gate electrode 7 by the gate-insulating film 6 or the like. On the bottom surface of the n+ type semiconductor substrate 1, a drain electrode 9 is formed. The drain electrode 9 is electrically connected to the semiconductor substrate 1. The drain electrode 9 is common to each MOSFET.

With reference to FIG. 1, the left side is the device region of the semiconductor device. In this region, the n type source layer 5 is provided in the surface of the p type base region 4. This provides a semiconductor device having an npn junction perpendicular to the n+ type semiconductor substrate 1 (in the z-direction in FIG. 1). The right side in FIG. 1 is the terminal region. In this region, the n type source layer 5 is not provided. There is thus no semiconductor device having the npn junction perpendicular to the semiconductor substrate 1.

In the semiconductor device of this embodiment, the super junction region including the n and p type pillar regions 2 and 3 is formed in the device region and also in the terminal region therearound. In the surface of the super junction region in the terminal region, a reduced surface field (RESURF) region 10 of p− type is formed. The RESURF region 10 may extend the depletion layer laterally (in the y-direction in FIG. 1) in the terminal region when the MOSFET is not rendered conductive. This may reduce the electric field concentration at the end portion of the p type base region 4 in the terminal region. As shown in the plan view of FIG. 1, in the semiconductor device of this embodiment, the RESURF region 10 in the terminal region has a comb-like planar shape with repeatedly-formed teeth having tips facing the end portion of the terminal region (in a direction away from the device region) in the x-y plane. The tip of the teeth is forward tapered (becomes gradually narrower at one end) toward its tip. On the surface of the terminal region including the surface of the RESURF region 10, a field insulating film 11 is formed. At the end portion of the terminal region, a field stop layer 12 is formed. The layer 12 is connected to a field stop electrode 13.

With reference to FIG. 1, the operation of the semiconductor device will now be described. It is assumed that during the operation, the n type source layer 5 and the p type base region 4 of each MOSFET in the device region are grounded through the source electrode 8. It is also assumed that the drain layer (the n+ type semiconductor substrate 1) is applied with a certain positive voltage via the drain electrode 9.

When turning on the semiconductor device, a certain positive voltage (a gate voltage of a threshold voltage or more) is applied to the gate electrode 7 of each MOSFET. An n type inversion layer is thus formed in the channel region in the p type base region 4. Electrons from the n type source layer 5 pass through the inversion layer and are injected to the drift layer (the n type pillar region 2). The electrons then reach the drain layer (the n+ type semiconductor substrate 1). Current thus flows from the n+ type semiconductor substrate 1 to the n type source layer 5.

When turning off the semiconductor device, a gate voltage less than the threshold voltage is applied to the gate electrode 7 of each MOSFET. The inversion layer thus disappears in the channel region in the p type base region 4. The electron injection from the n type source layer 5 to the n type pillar region 2 is thus stopped. No current thus flows from the drain layer (the n+ type semiconductor substrate 1) to the n type source layer 5. When the device is turned off, the depletion layer extending laterally from the pn junction interface between the n and p type pillar regions 2 and 3 holds the breakdown voltage of the semiconductor device.

When the semiconductor device is turned off in this embodiment, the depletion layer extends from the pn junction interface between the p type base region 4 and the n type pillar regions 2. The depletion layer also extends from the p type pillar regions 3. A small curvature radius portion may then occur in the depletion layer in the vicinity under the end portion of the p type base region 4 that extends in the terminal region of the semiconductor device. Another small curvature radius portion may occur in the depletion layer at the end portion of the RESURF region 10 in the surface of the terminal region of the semiconductor device. The electric field may concentrate at the small curvature radius portions in the depletion layer. This may reduce the breakdown voltage of the terminal region of the semiconductor device.

Whether the electric field increases at the end portion of the p type base region 4 or at the end portion of the RESURF region 10 depends on the impurity amount balance between the n and p type pillar regions 2 and 3. If the n type pillar region 2 contains more impurity than the p type pillar region 3, the electric field increases at the end portion of the p type base region 4. If the p type pillar region 3 contains more impurity than the n type pillar region 2, the electric field increases at the end portion of the RESURF region 10.

If the electric field increases at the end portion of the p type base region 4 or the RESURF region 10, avalanche breakdown occurs even for a low applied voltage. The breakdown voltage is thus reduced. The increased electric field causes carriers, particularly holes. When the carriers are introduced into the field insulating film 11, the reliability is reduced, including the insulation degradation, the leak current increase, or the device breakdown. It is thus required to reduce the electric field concentration at the end portions of the p type base region 4 and the RESURF region 10.

To reduce the electric field concentration at the end portions of the p type base region 4 and the RESURF region 10, it is necessary to adjust the concentration of the RESURF region 10. Specifically, it is necessary to increase the p type impurity concentration in a portion of the RESURF region 10 that is in contact with the p type base region 4. It is also necessary to decrease the p type impurity concentration in the RESURF region 10 at the end portion of the terminal region. Such an impurity concentration distribution may be provided using a plurality of lithographies and ion implantations to gradually change the impurity concentration in the RESURF region 10. It is, however, difficult to adjust the concentration in the RESURF region 10 with high accuracy due to the lithography misalignment and the ion implantation variation or the like.

In FIG. 1, in contrast, the RESURF region 10 in the terminal region of the semiconductor device has a comb-like planar shape with repeatedly-formed teeth having tips facing the end portion of the terminal region, and the tip of the teeth is forward tapered toward its tip. Even if, therefore, the RESURF region 10 has a totally uniform impurity concentration, a condition may be provided that is similar to the condition where a higher concentration occurs at the end portion of the p type base region 4 and a lower concentration occurs at the end portion of the terminal region.

The RESURF region 10 thus configured may reduce the electric field concentration at the end portion of the p type base region 4 and the end portion of the RESURF region 10. The structure of the RESURF region 10 in this embodiment may be formed using one lithography step and one ion implantation step. It is thus less likely to have misalignment or ion implantation variation, thus providing stable characteristics. It is therefore possible to decrease the electric field at the end portion of the p type base region 4. It is thus less likely to have device breakdown even if a large amount of holes are injected into the end portion of the p type base region 4 during the avalanche breakdown or the built-in diode recovery or the like. In other words, it is possible to provide high avalanche resistance and high recovery capability.

The semiconductor device of this embodiment may reduce the electric field concentration at the end portion of the p type base region 4 and the end portion of the RESURF region 10. It is thus possible to control the reduction of the terminal breakdown voltage and the reliability degradation due to the impurity amount variation in the p and n type pillar regions 3 and 2. The less reduction of the breakdown voltage for the process variation allows for higher impurity concentration in the super junction region and thus lower ON-resistance.

Figure 2:
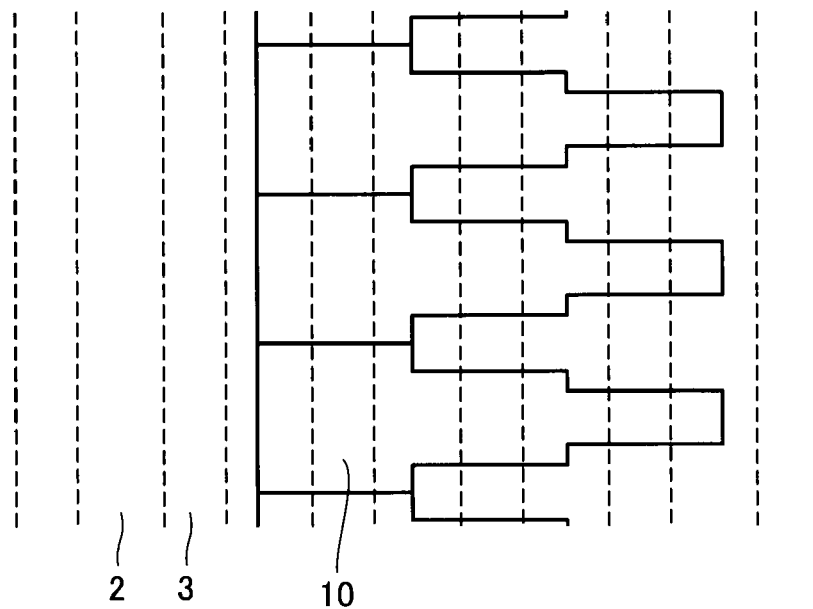
FIG. 2 is a plan view of the structure of a semiconductor device in another example of the first embodiment.
Figure 3:
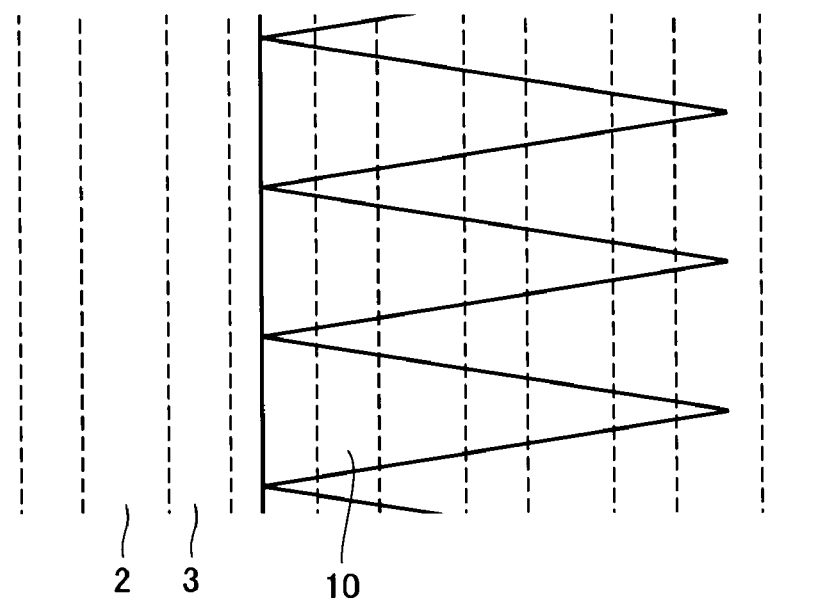
FIG. 3 is a plan view of the structure of a semiconductor device in another example of the first embodiment.
Figure 4:
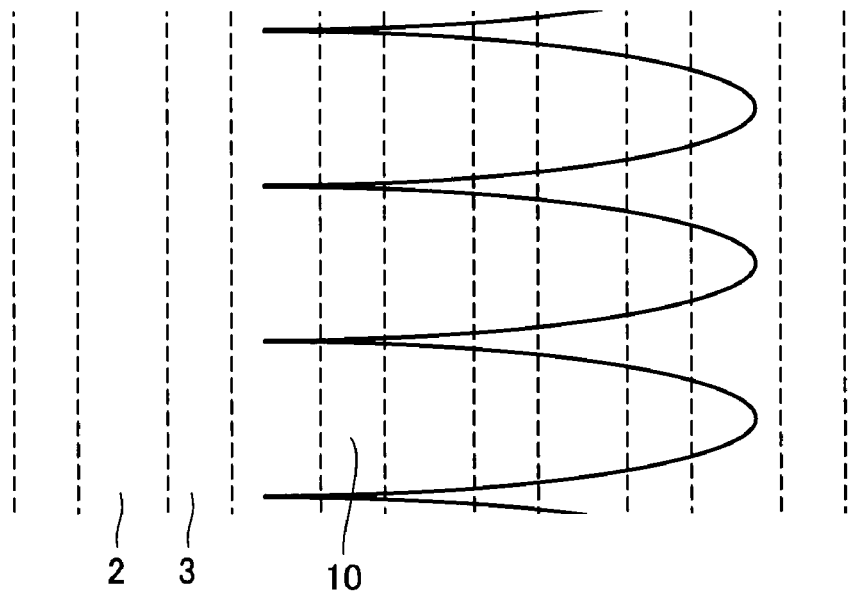
FIG. 4 is a plan view of the structure of a semiconductor device in another example of the first embodiment.
Figure 5:
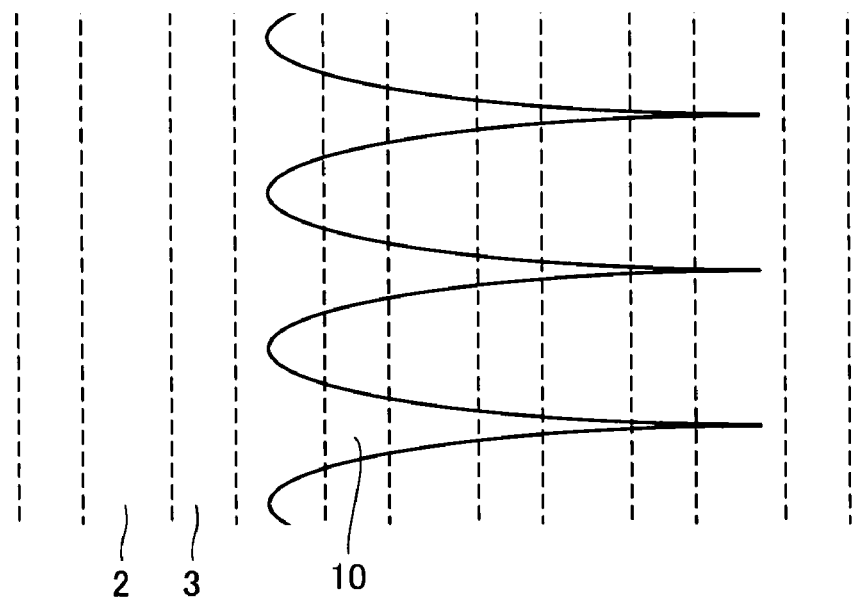
FIG. 5 is a plan view of the structure of a semiconductor device in another example of the first embodiment.

The RESURF region 10 of this embodiment is not formed on the whole terminal region surface. The RESURF region 10 is provided having a comb-shaped plane that has teeth toward the end portion of the terminal region, and each tooth has a trapezoid shape and is tapered toward the end portion of the terminal region. The plane shape of the RESURF region 10 is not limited to the shape in FIG. 1. Similar advantages may be provided only when the shape decreases in width toward the end of the terminal region. With reference to FIG. 2, for example, each of the teeth may have a pattern in which the width changes stepwise. With reference to FIG. 3, each of the teeth may also have a triangular pattern. The width may be decreased to any other degree. With reference to FIG. 4, for example, each of the teeth may have an oblong shape that sharply decrease in width at the end of the terminal region. With reference to FIG. 5, each tooth may also have a shape that sharply increases in width toward the p type base region 4 to allow each space between the teeth to have an oblong shape.

Figure 6:
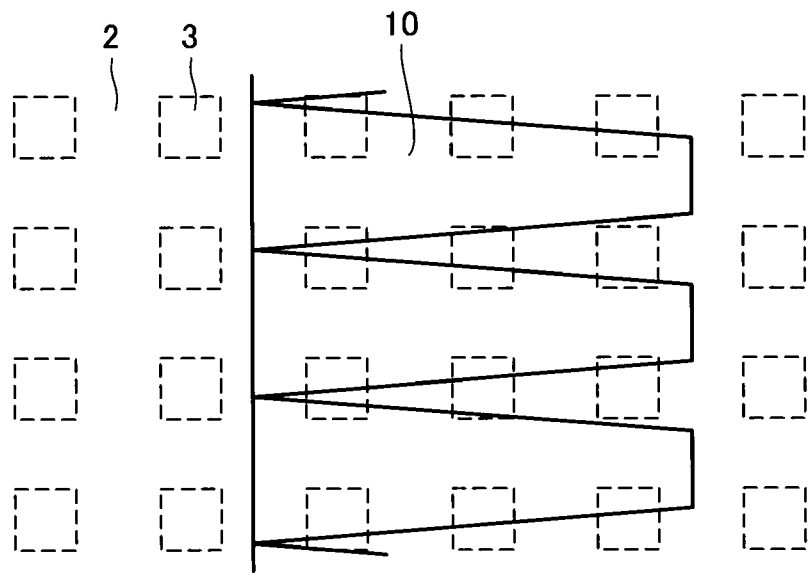
FIG. 6 is a plan view of the structure of a semiconductor device in another example of the first embodiment.
Figure 7:
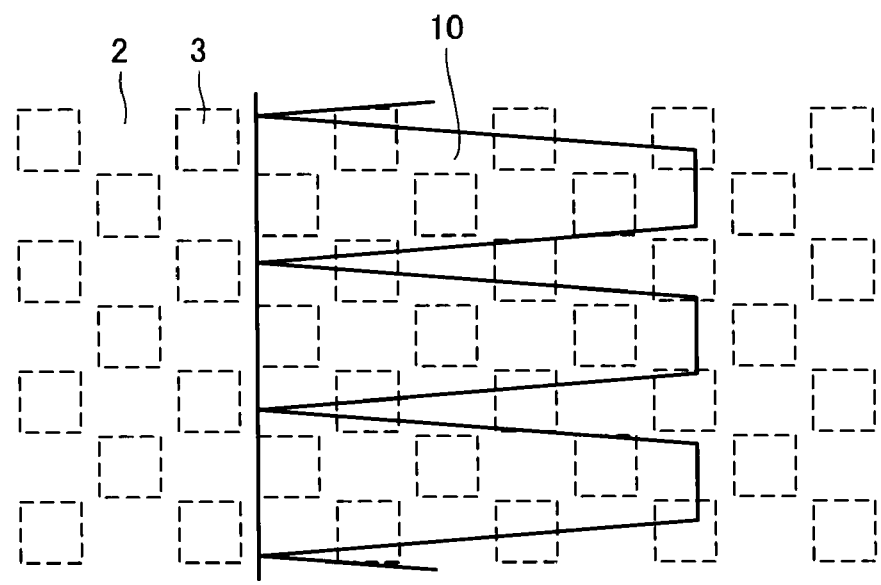
FIG. 7 is a plan view of the structure of a semiconductor device in another example of the first embodiment.

The plane pattern of each pillar region in the super junction region may be any other patterns. Similar advantages may be provided for other plane patterns than the stripe pattern. For example, the present invention is applicable if the n type pillar regions 2 are provided in a lattice pattern as shown in FIG. 6 and if the p type pillar regions 3 are provided in an offset mesh pattern as shown in FIG. 7.

Second Embodiment

Figure 8:
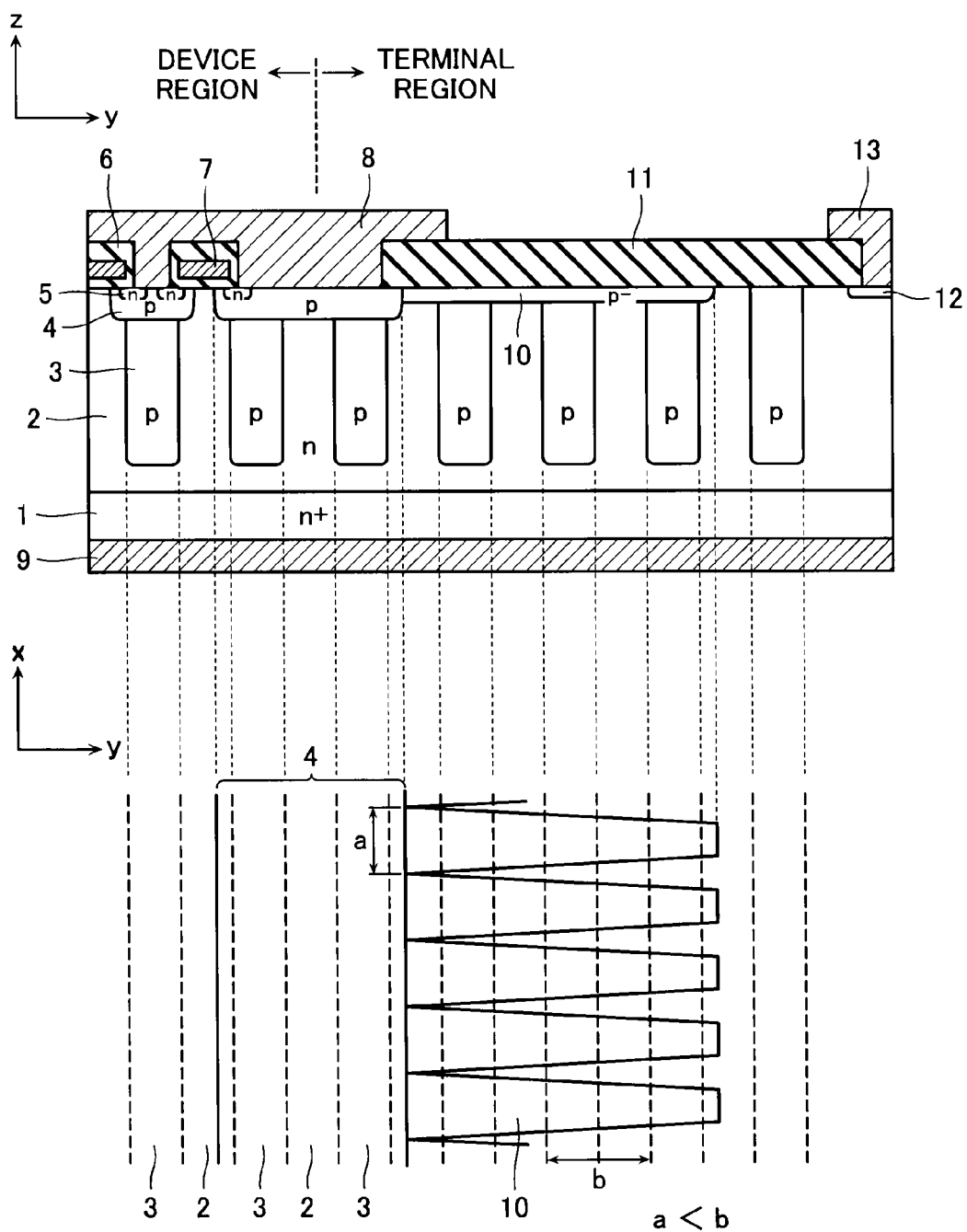
FIG. 8 is a cross-sectional view and a plan view of the structure of a semiconductor device according to a second embodiment.

With reference to FIG. 8, a second embodiment of the present invention will now be described. FIG. 8 is a cross-sectional view and a plan view of the structure of a semiconductor device according to the second embodiment of the present invention. In FIG. 8, the upper portion is a cross-sectional view of the semiconductor device taken along the y-z plane. The lower portion in FIG. 8 is a plan view of the semiconductor device taken along the x-y plane. The semiconductor device in this embodiment in FIG. 8 has a configuration generally the same as that of the semiconductor device in the first embodiment. Accordingly, like elements are provided with like reference symbols and their description are omitted here.

In the device region and the terminal region of the semiconductor device in FIG. 8, the n and p type pillar regions 2 and 3 are alternately provided in a lateral direction, forming a stripe shape. The regions 2 and 3 comprise the super junction region. In the terminal region, each of the repeated teeth (a unit of the repeated projections) in the comb-shaped RESURF region 10 has a width a. One set of the n and p type pillar regions 2 and 3 alternately formed in the super junction region has a width b. The width a is smaller than the width b.

In the terminal region of the semiconductor device in this embodiment, the depletion layer extending from the RESURF region 10 when the semiconductor device is turned off is easily depressed at a low voltage. The RESURF region 10 may be completely depressed before the depletion layer extending from the n and p type pillar regions 2 and 3 is completely depressed. The electric field concentration at the end portion of the RESURF region 10 is thus reduced. This may control the reduction of the terminal breakdown voltage and the reliability degradation.

In this embodiment, the n and p type pillar regions 2 and 3, which comprise the super junction region, may not be formed in the stripe pattern. As shown in FIG. 6, for example, the n type pillar regions 2 may be disposed in a lattice pattern. As shown in FIG. 7, the p type pillar regions 3 may be disposed in an offset mesh pattern. In this case, the width of one set of the n and p type pillar regions 2 and 3 is the width of each repeated unit of the n and p type pillar regions 2 and 3 in the super junction region.

Third Embodiment

Figure 9:
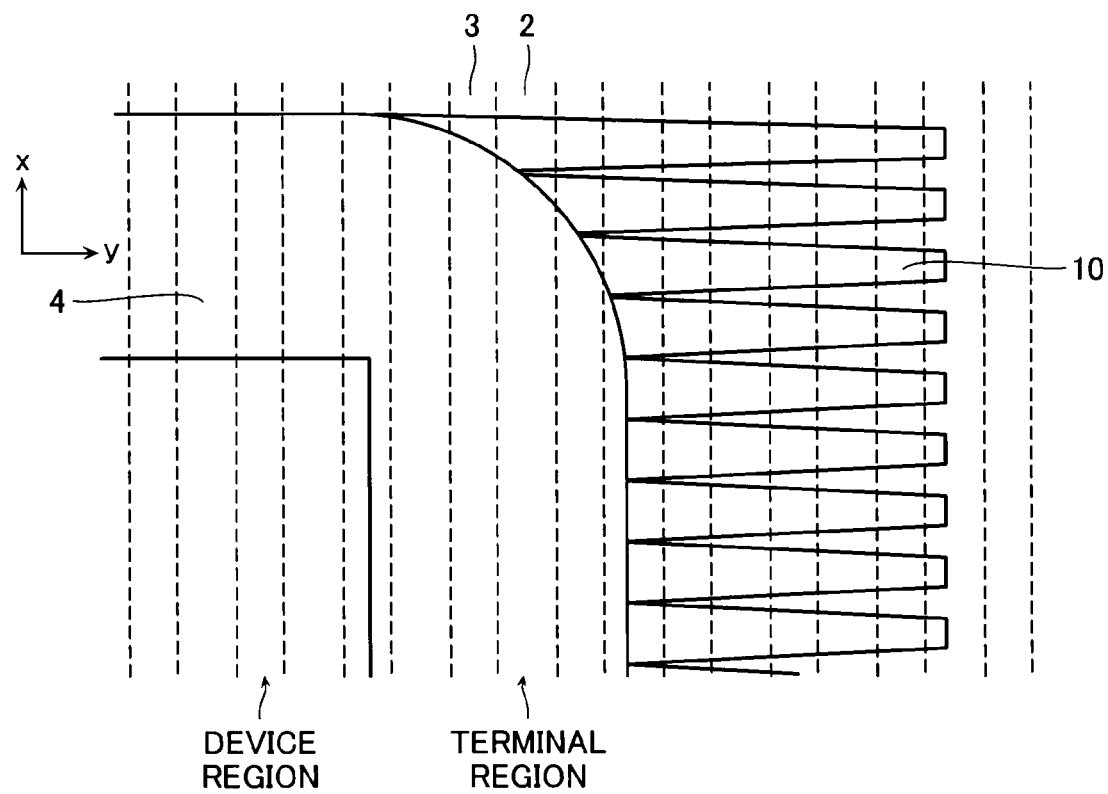
FIG. 9 is a plan view of the structure of a semiconductor device in a third embodiment.

With reference to FIG. 9, a third embodiment of the present invention will now be described. FIG. 9 is a plan view of the structure of a semiconductor device according to the third embodiment of the present invention. The semiconductor device in this embodiment in FIG. 9 has a configuration generally the same as that of the semiconductor device in the first embodiment. Accordingly, like elements are provided with like reference symbols and their description are omitted here.

In the device region and the terminal region of the semiconductor device in FIG. 9, the n and p type pillar regions 2 and 3 are alternately provided in a lateral direction, forming a stripe shape. The regions 2 and 3 comprise the super junction region. The RESURF region 10 in the terminal region in this embodiment has a comb-like planar shape with repeatedly-formed teeth having tips facing the end portion of the terminal region. The tip of the teeth is forward tapered toward its tip. Each of the teeth also extends in a direction (in the y-direction in FIG. 9) generally perpendicular to the stripe shape in the super junction region from the p type base region 4.

When the semiconductor device is applied with a voltage, a depletion layer extends in the RESURF region 10 in the terminal region from the pn junction between the RESURF region 10 and the n type pillar region 2. In a region in the terminal region except the RESURF region 10, a depletion layer extends from the pn junction between the p and n type pillar regions 3 and 2 in the super junction region.

In the lateral direction in the terminal region (in the y-direction in FIG. 9), the formation of the RESURF region 10 may extend the depletion layer. In the vertical direction in the terminal region (in the x-direction in FIG. 9), no RESURF region 10 is needed because the depletion layer extends from the p type pillar region 3 in the super junction region. No RESURF region 10 in the vertical direction in the terminal region may reduce the affect from the impurity concentration variation during the formation of the RESURF region 10. The stable characteristics may thus be provided.

Figure 10:
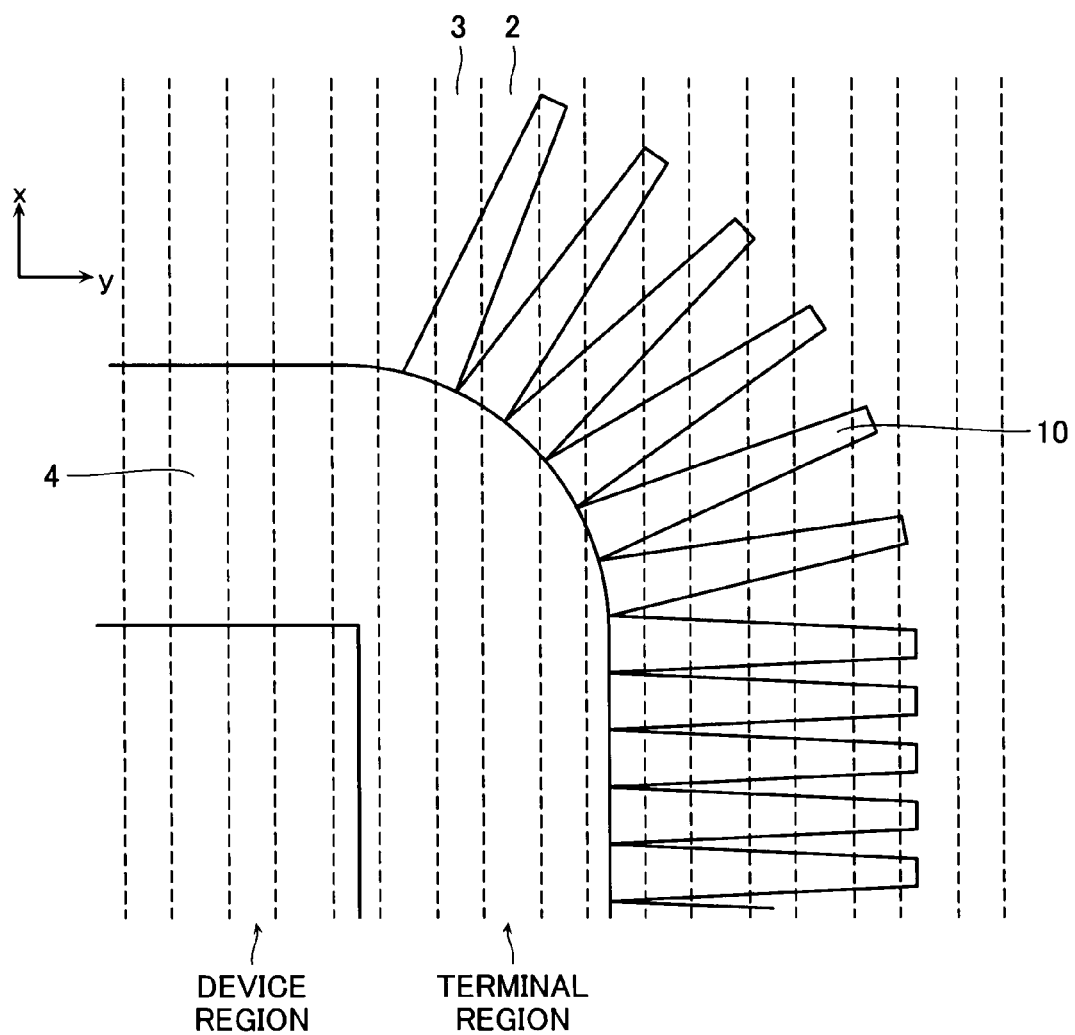
FIG. 10 is a plan view of the structure of a semiconductor device in another example of the third embodiment.

In the semiconductor device in FIG. 9, the corner portion in the p type base region 4 has a depletion layer extending both in the longitudinal direction of the stripe and in the direction perpendicular thereto. Preferably, the RESURF region 10 is formed at the corner portion to form the depletion layer in the direction perpendicular to the longitudinal direction of the stripe. The RESURF region 10 at the corner portion may be formed perpendicular to the longitudinal direction of the stripe as shown in FIG. 9. That RESURF region 10 may also be formed at different angles along the corner portion as shown in FIG. 10.

Fourth Embodiment

Figure 11:
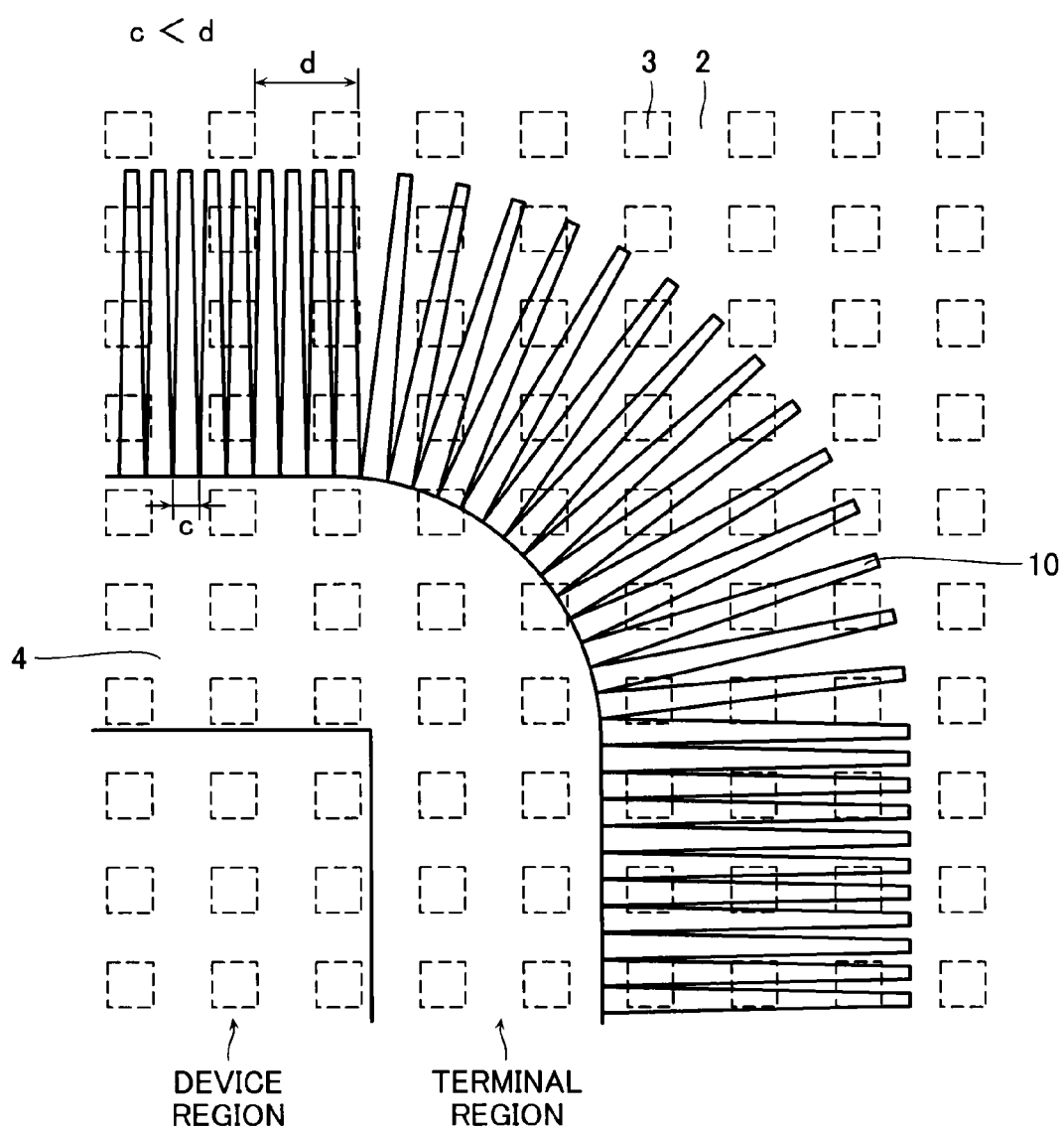
FIG. 11 is a plan view of the structure of a semiconductor device in a fourth embodiment.

With reference to FIG. 11, a fourth embodiment of the present invention will now be described. FIG. 11 is a plan view of the structure of a semiconductor device according to the fourth embodiment of the present invention. The semiconductor device in this embodiment in FIG. 11 has a configuration generally the same as that of the semiconductor device in the first embodiment. Accordingly, like elements are provided with like reference symbols and their description are omitted here.

In the semiconductor device in FIG. 11, the super junction region comprises the n type pillar regions 2 disposed in a lattice pattern. The RESURF region 10 has a comb-shaped plane that has teeth toward the end portion of the terminal region. The region 10 is formed around the entire periphery of the p type base region 4. Each of the p type pillar regions 3 formed in the super junction region and the p type base regions 4 are connected by the RESURF region 10. Each of the repeated teeth in the comb-shaped RESURF region 10 has a width c. One set of the n and p type pillar regions 2 and 3 alternately formed in the super junction region has a width d. The width c is smaller than the width d.

In this embodiment, when the semiconductor device is applied with a high voltage, each p type pillar region 3 connected to the RESURF region 10 in the terminal region is immediately depressed. The width c of each tooth in the RESURF region 10 is smaller than the width d of the n and p type pillar regions 2 and 3. Any one of the teeth in the comb-shaped RESURF region 10 is, therefore, connected to the p type pillar region 3. Each tooth in the RESURF region 10 has a tapered width. This effect uniformly propagates in the super junction region. Both in the p and n type pillar regions 3 and 2, therefore, the electric field concentration may be reduced at the end portion of the RESURF region 10.

Figure 12:
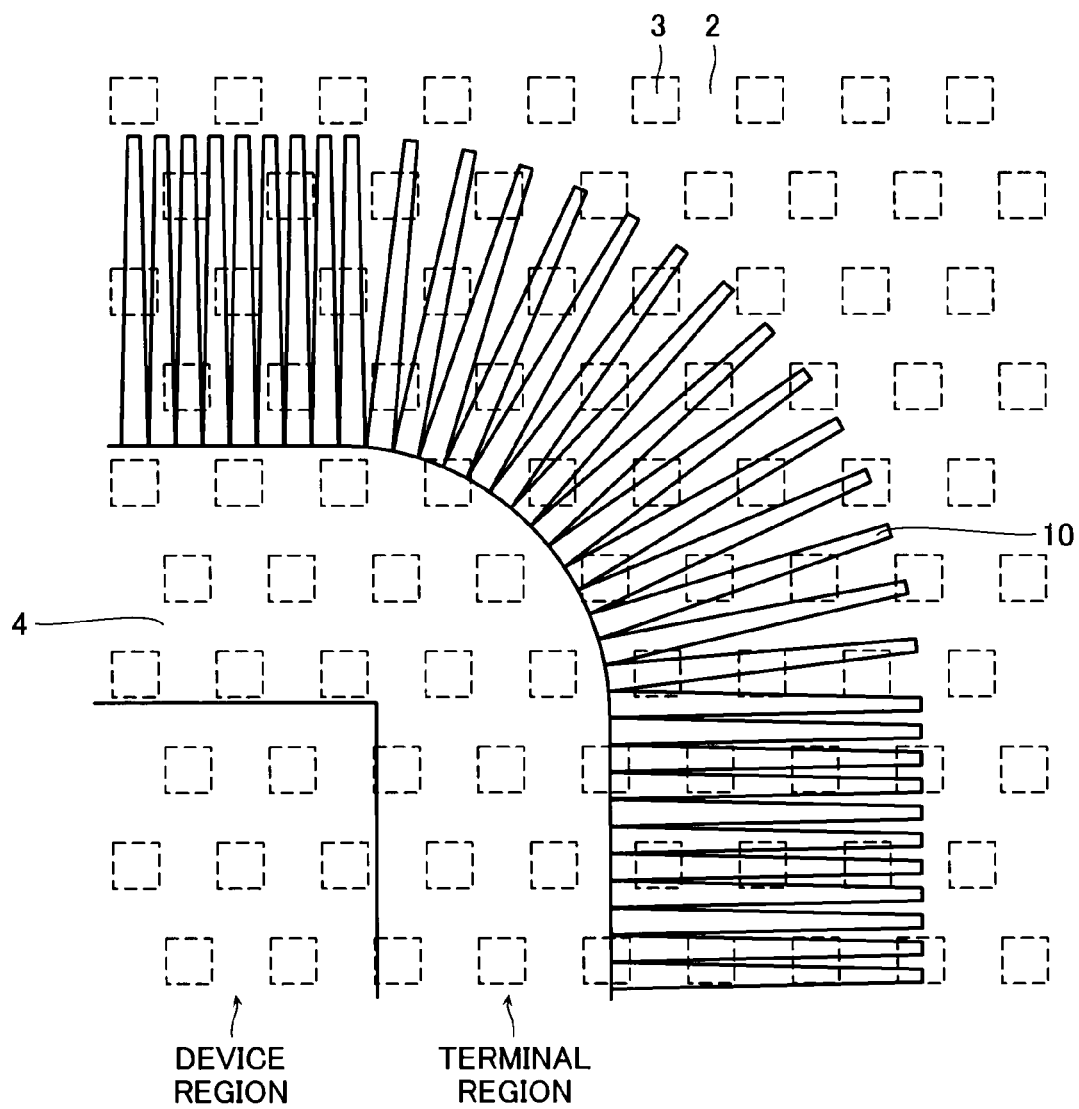
FIG. 12 is a plan view of the structure of a semiconductor device in another example of the fourth embodiment.
Figure 13:
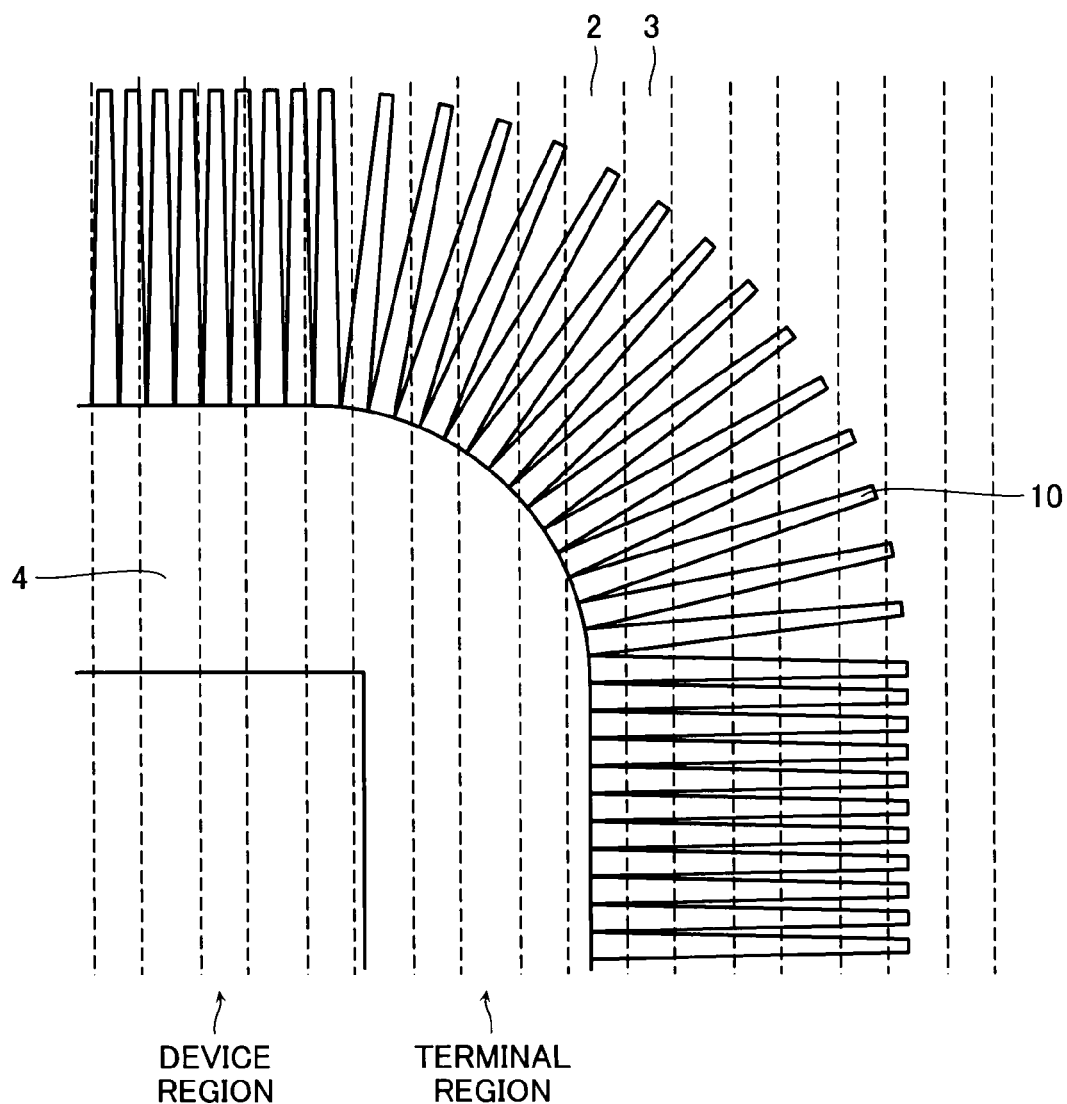
FIG. 13 is a plan view of the structure of a semiconductor device in another example of the fourth embodiment.

In this embodiment, the plane shape of the super junction region is not limited to the lattice pattern. As shown in FIG. 12, for example, the p type pillar regions 3 may be disposed in an offset mesh pattern. As shown in FIG. 13, the n type pillar region 2 may be disposed in a stripe shape. As in the lattice pattern, the effect that each tooth in the RESURF region 10 has a tapered width uniformly propagates. This may reduce the electric field at both ends in the RESURF region 10.

Fifth Embodiment

Figure 14:
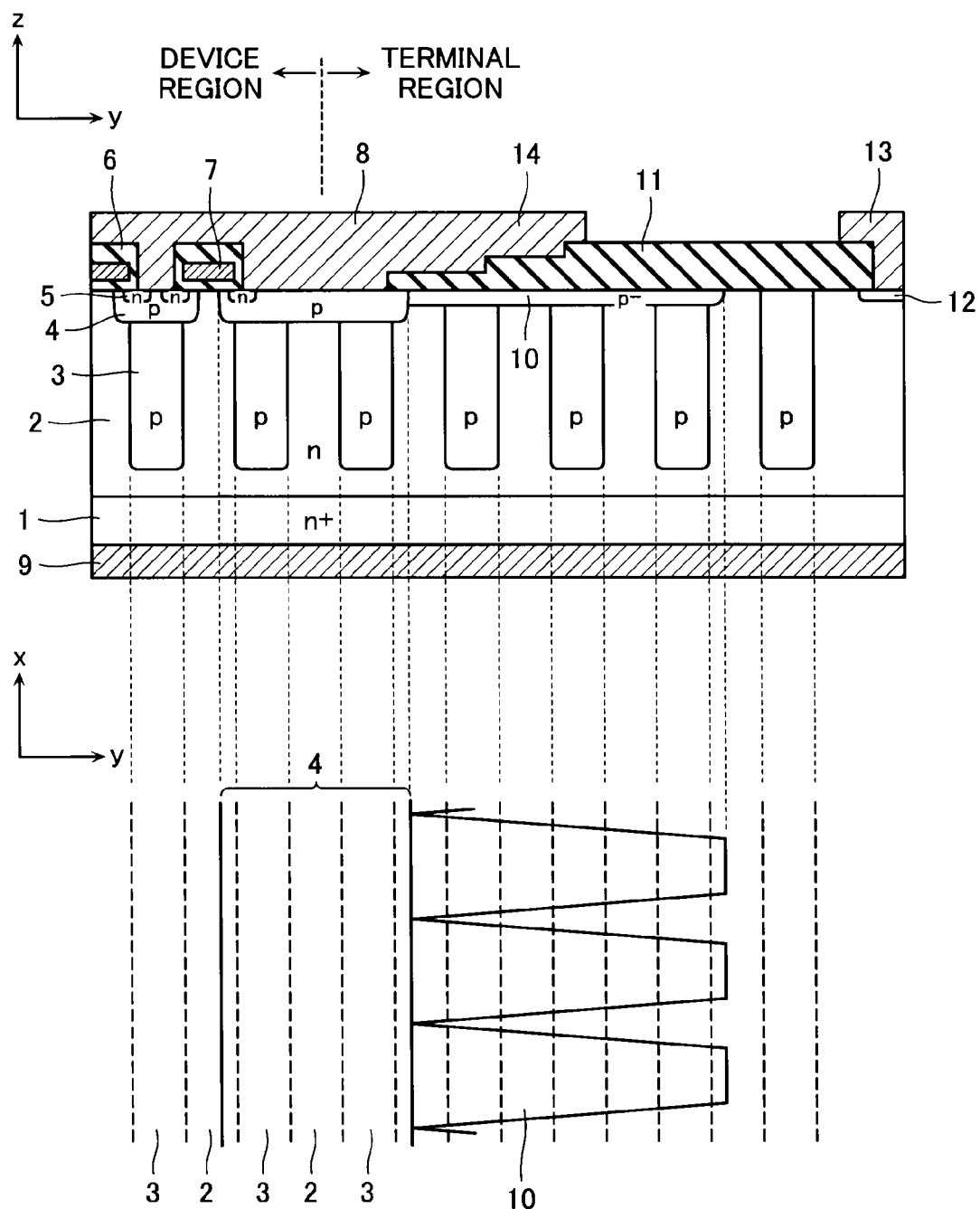
FIG. 14 is a cross-sectional view and a plan view of the structure of a semiconductor device according to a fifth embodiment.

With reference to FIG. 14, a fifth embodiment of the present invention will now be described. FIG. 14 is a cross-sectional view and a plan view of the structure of a semiconductor device according to the fifth embodiment of the present invention. In FIG. 14, the upper portion is a cross-sectional view of the semiconductor device taken along the y-z plane. The lower portion in FIG. 14 is a plan view of the semiconductor device taken along the x-y plane. The semiconductor device in this embodiment in FIG. 14 has a configuration generally the same as that of the semiconductor device in the first embodiment. Accordingly, like elements are provided with like reference symbols and their description are omitted here.

In the semiconductor device in FIG. 14, on the top surface of the RESURF region 10 in the terminal region, a field plate electrode 14 is formed via the field insulating film 11. The field plate electrode 14 is connected to the source electrode 8. Even if the impurity concentration varies in the RESURF region 10 or the charge occurs in the field insulating film 11, the field plate electrode 14 may reduce the electric field concentration at the end portion of the p type base region 4. This may reduce the breakdown voltage variation or the reliability variation due to the process variation.

Figure 15:
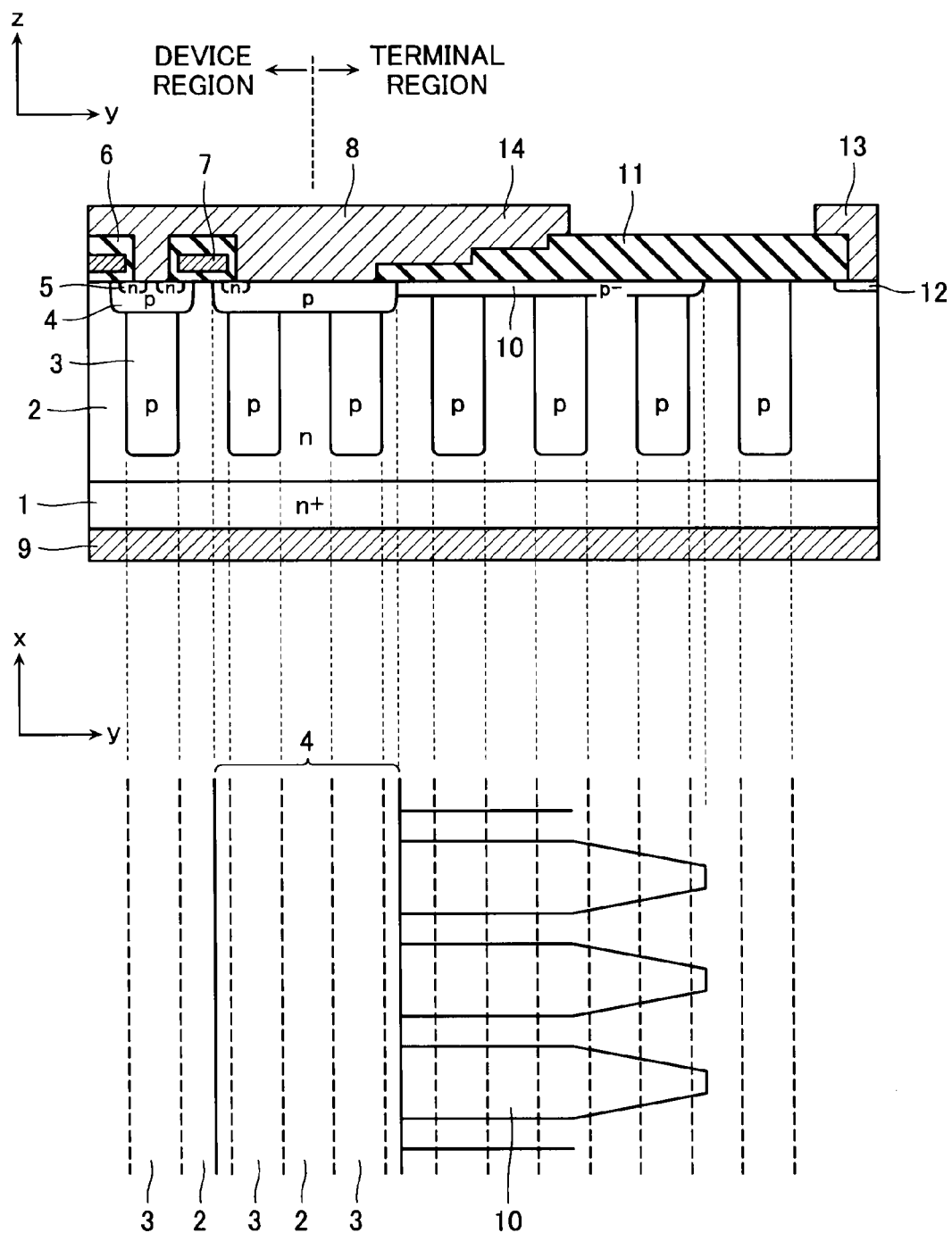
FIG. 15 is a cross-sectional view and a plan view of the structure of a semiconductor device in another example of the fifth embodiment.
Figure 16:
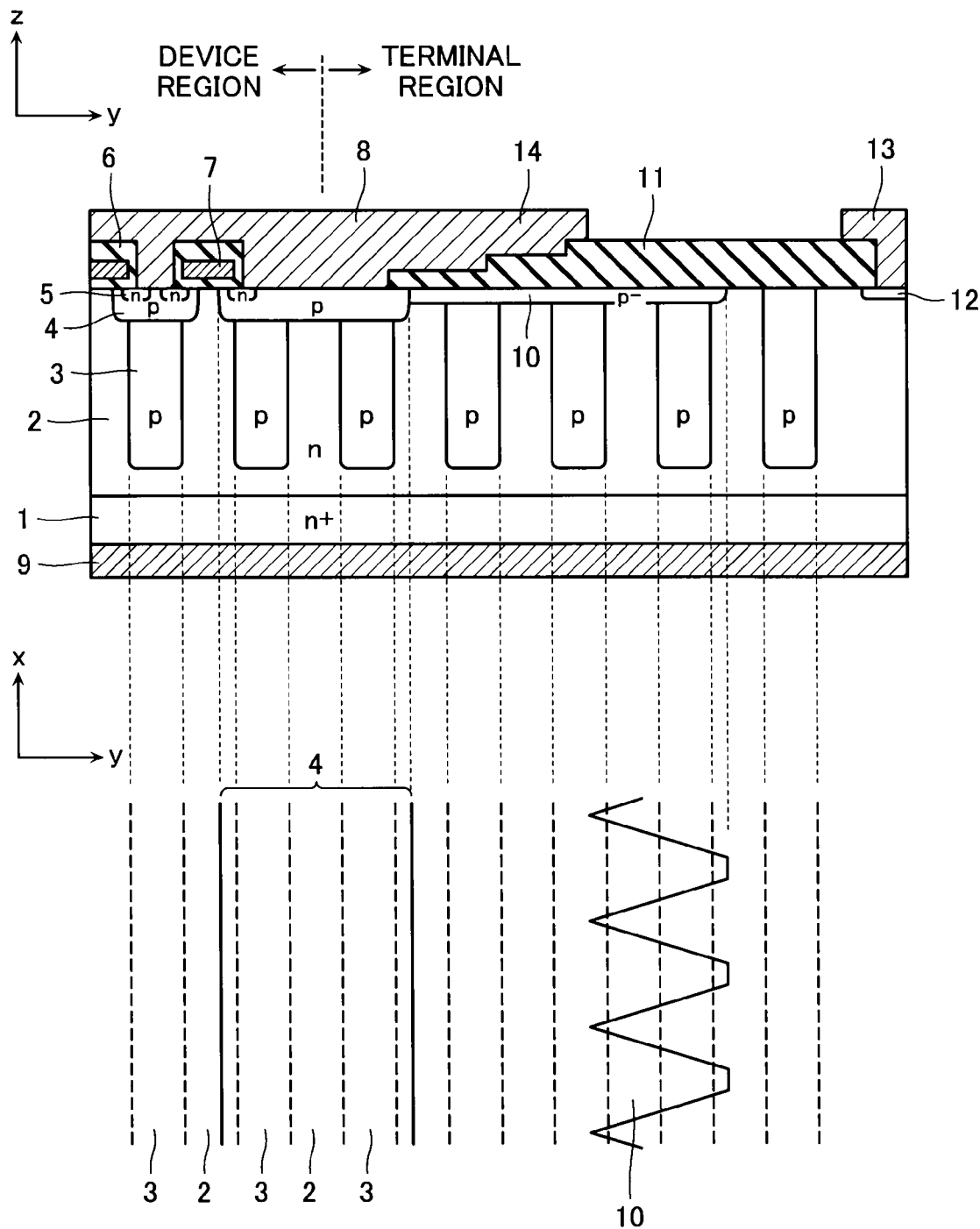
FIG. 16 is a cross-sectional view and a plan view of the structure of a semiconductor device in another example of the fifth embodiment.

In the semiconductor device of this embodiment, the field plate electrode 14 may reduce the electric field concentration at the end portion of the p type base region 4. It is thus unnecessary to increase the impurity concentration of the RESURF region 10 near the p type base region 4 under the field plate electrode. With reference to FIG. 15, therefore, each tooth in the RESURF region 10 may have a constant width under the field plate electrode 14. With reference to FIG. 16, each tooth in the RESURF region 10 may also be connected each other to form RESURF region 10 on the entire surface under the field plate electrode 14.

Thus, although the invention has been described with respect to particular embodiments thereof, it is not limited to those embodiments. It will be understood that various modifications and additions and the like may be made without departing from the spirit of the present invention. Although, for example, the first conductivity type is n type and the second conductivity type is p type in the above embodiments, the first conductivity type may be p type and the second conductivity type may be n type. Various changes may also be made in the device region and the terminal region of the semiconductor device.

Figure 17:
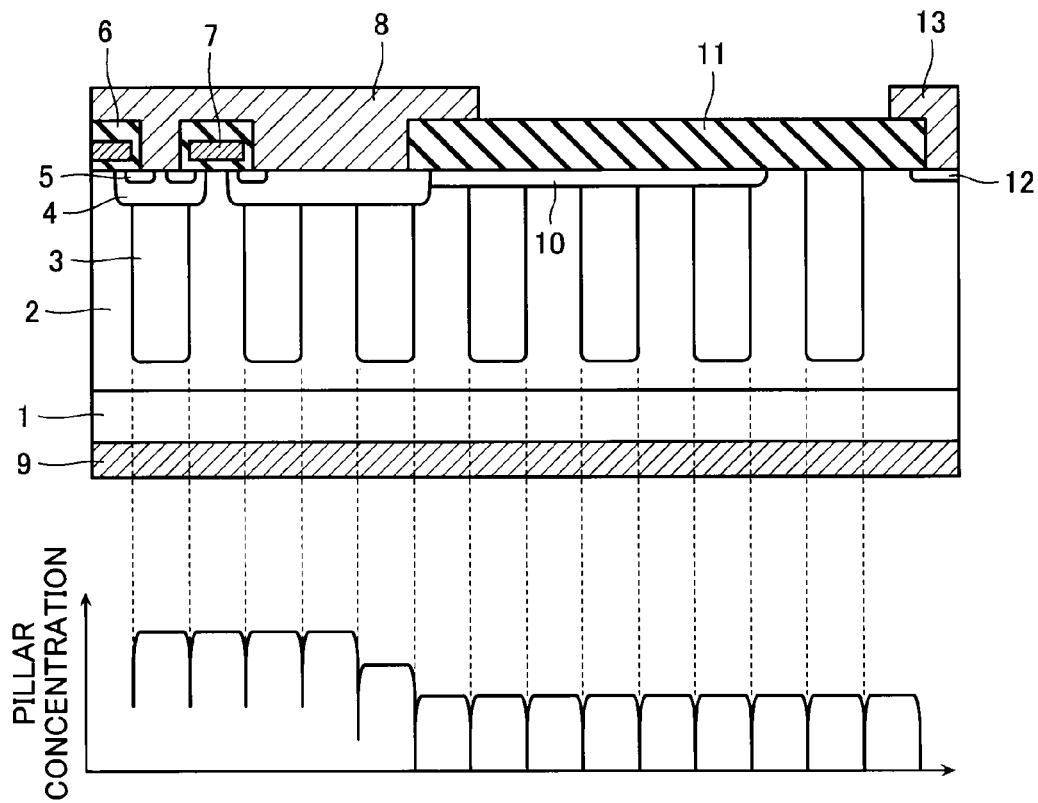
FIG. 17 is a cross-sectional view of the structure of a semiconductor device in another example.
Figure 18:
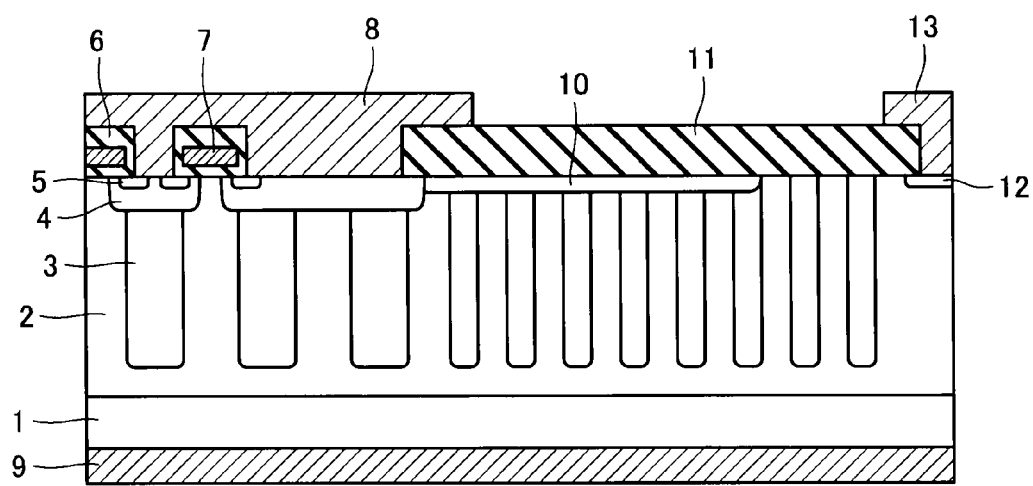
FIG. 18 is a cross-sectional view of the structure of a semiconductor device in another example.

With reference to FIG. 17, for example, in the semiconductor device, the impurity concentrations of the pillar regions in the super junction region in the terminal region is lower than those of the pillar regions in the device region. The super junction region in the terminal region may thus be completely depressed at a low voltage. The terminal region may thus have a higher breakdown voltage than the device region. If the terminal region has a higher breakdown voltage than the device region, the device breakdown voltage will depend on the breakdown voltage in the device region. Therefore, the device breakdown voltage may not be affected by the variation of the impurity concentration of the RESURF region 10 or the like. Additionally, the avalanche breakdown in the terminal region may be controlled, thus providing high avalanche resistance. With reference to FIG. 18, the repeat distance in the super junction region may be smaller in the terminal region than in the device region to provide similar advantages. Alternatively, in the pillar regions in the super junction region in the terminal region, the impurity concentration may be decreased and the repeating cycle may be shortened.

Figure 19:
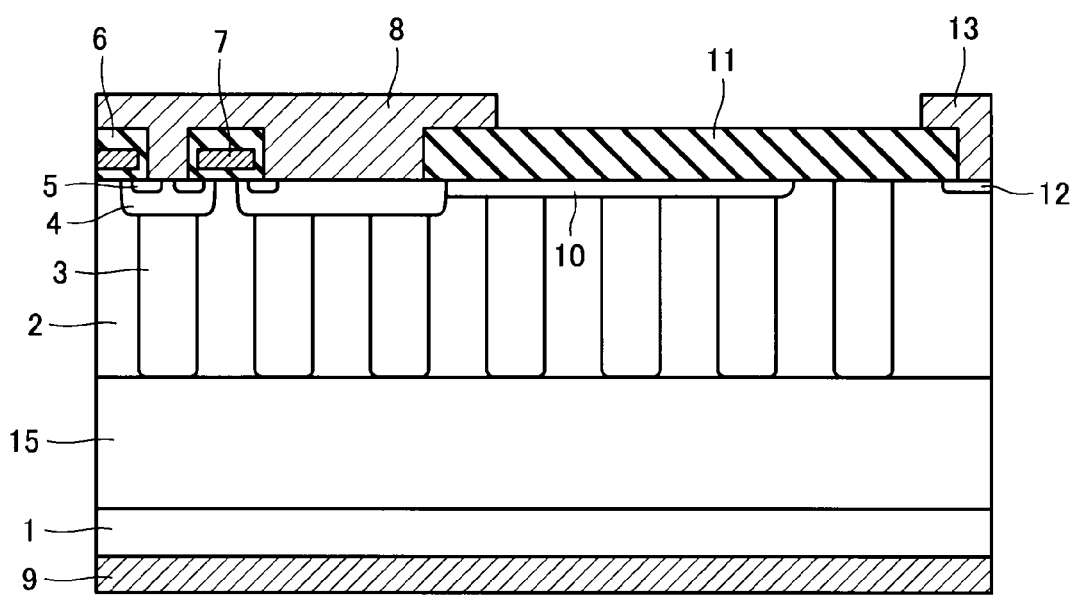
FIG. 19 is a cross-sectional view of the structure of a semiconductor device in another example.

With reference to FIG. 19, in the semiconductor device, an n− type semiconductor layer 15 is formed between the super junction region and the n+ type semiconductor substrate 1. With the n− type semiconductor layer 15 formed, both the super junction region and the n− type semiconductor layer 15 may hold the voltage, thereby increasing the device breakdown voltage. Again in the structure including the n− type semiconductor layer 15, the electric field distribution on the surface in the terminal region may be controlled by the design of the RESURF region 10. This may provide similar advantages to those in the above embodiments.

The plane patterns of the gate electrode 7 and the super junction region of the MOSFET are not limited to the stripe pattern. They may be a lattice pattern or a checkered pattern. Although it is assumed in the above embodiments that the gate electrode 7 of the semiconductor device has a planar gate structure, the electrode 7 may have a trench gate structure. The forming process of the super junction region is not limited to those described above. The super junction region may be formed using various methods including repeating of the ion implantation and the buried growth, burying a trench during the crystal growth, and a plurality of ion implantations with different accelerating voltages.

Although it is assumed in the above embodiments that the semiconductor material for the MOSFET is silicon, other semiconductor materials may also be used, including compound semiconductors such as silicon carbide (SiC) and gallium nitride (GaN), and a wide gap band semiconductor such as diamond. Although it is assumed in the above embodiments that the semiconductor device is the MOSFET having a super junction region, any other semiconductor devices that have a super junction region may be applied, including a schottky barrier diode (SBD), a combined device of the MOSFET and the SBD, a static induction transistor (SIT), and an insulated gate bipolar transistor (IGBT).

What is claimed is:

1. A semiconductor device comprising:
   a semiconductor substrate of a first conductivity type having top and bottom surfaces that are opposed to each other, the semiconductor substrate having a device region and a terminal region surrounding the device region;
   a super junction region having, on the top surfaces of the device and terminal regions, a first semiconductor pillar region of the first conductivity type and a second semiconductor pillar region of a second conductivity type, the first and second semiconductor pillar regions being alternately provided along the top surface of the semiconductor substrate;
   a first main electrode electrically connected to the bottom surface of the semiconductor substrate;
   a semiconductor base region of the second conductivity type selectively provided in the top surface of the super junction region;
   a semiconductor diffusion region of the first conductivity type selectively provided in the top surface of the semiconductor base region;
   a second main electrode electrically connected to the semiconductor base region and the semiconductor diffusion region;
   a control electrode provided, via an insulating film, on a region that includes the semiconductor diffusion region, the semiconductor base region, and the first semiconductor pillar region; and
   a RESURF region of the second conductivity type provided in the top surface of the super junction region in the terminal region, the RESURF region being connected to the semiconductor base region,
   the RESURF region having a comb-like planar shape with repeatedly-formed teeth having tips facing the end portion of the terminal region, and the tip of the teeth being forward tapered toward its tip.

2. The semiconductor device according to claim 1, wherein in the plane of the RESURF region, each of the teeth has a trapezoid shape.

3. The semiconductor device according to claim 1, wherein in the plane of the RESURF region, each of the teeth has a stepped width to be tapered.

4. The semiconductor device according to claim 1, wherein in the plane of the RESURF region, each of the teeth has a triangle shape.

5. The semiconductor device according to claim 1, wherein in the plane of the RESURF region, each of the teeth has an oblong shape that decreases in width at the end portion of the terminal region.

6. The semiconductor device according to claim 1, wherein in the plane of the RESURF region, each of the teeth has a shape that allows each space between the teeth to have an oblong shape.

7. The semiconductor device according to claim 1, wherein in the super junction region, the first and second semiconductor pillar regions are disposed in a lattice or in an offset mesh.

8. The semiconductor device according to claim 1, wherein one set of the first and second semiconductor pillar regions alternately provided in the super junction region has a width larger than a width of one unit of the teeth.

9. The semiconductor device according to claim 1, wherein the teeth in the RESURF region are provided in a direction generally perpendicular to a longitudinal direction of the first and second semiconductor pillar regions alternately provided in the super junction region.

10. The semiconductor device according to claim 1, wherein the RESURF region is provided around the entire periphery of the semiconductor base region.

11. The semiconductor device according to claim 10, wherein one set of the first and second semiconductor pillar regions alternately provided in the super junction region has a width larger than a width of one unit of the teeth.

12. The semiconductor device according to claim 10, wherein in the super junction region, the first and second semiconductor pillar regions are disposed in a lattice or in an offset mesh.

13. The semiconductor device according to claim 1, further comprising a field plate electrode on the RESURF region via a field insulating film.

14. The semiconductor device according to claim 13, wherein in the plane of the RESURF region, each tooth has a constant width under the field plate electrode.

15. The semiconductor device according to claim 13, wherein in the plane of the RESURF region, each tooth is connected under the field plate electrode.

16. The semiconductor device according to claim 1, wherein
the impurity concentrations in the first and second semiconductor pillar regions in the super junction region in the terminal region is lower than those in the first and second semiconductor pillar regions in the super junction region in the device region.

17. The semiconductor device according to claim 1, wherein
the repeat distance of the first and second semiconductor pillar regions in the super junction region in the terminal region is smaller than that of the first and second semiconductor pillar regions in the super junction region in the device region.

18. The semiconductor device according to claim 1, further comprising a semiconductor region of the first conductivity type between the super junction region and the semiconductor substrate.

* * * * *